United States Patent
Liu et al.

(10) Patent No.: US 9,698,799 B2
(45) Date of Patent: Jul. 4, 2017

(54) PHASE LOCKED LOOP FREQUENCY CALIBRATION CIRCUIT AND METHOD

(71) Applicant: SHANGHAI EASTSOFT MICROELECTRONICS CO., LTD., Shanghai (CN)

(72) Inventors: Ruijin Liu, Shanghai (CN); Xu Zhang, Shanghai (CN); Jingjing Tao, Shanghai (CN); Jiejie Lv, Shanghai (CN)

(73) Assignee: SHANGHAI EASTSOFT MICROELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/191,457

(22) Filed: Jun. 23, 2016

(65) Prior Publication Data

US 2016/0308542 A1    Oct. 20, 2016

Related U.S. Application Data

(63) Continuation of application No. PCT/CN2014/078264, filed on May 23, 2014.

(30) Foreign Application Priority Data

Dec. 24, 2013 (CN) .......................... 2013 1 0724463

(51) Int. Cl.
H03L 7/06 (2006.01)
H03L 7/10 (2006.01)
(Continued)

(52) U.S. Cl.
CPC ............... *H03L 7/102* (2013.01); *H03L 7/08* (2013.01); *H03L 7/0891* (2013.01); *H03L 7/093* (2013.01);
(Continued)

(58) Field of Classification Search
USPC ....................................................... 327/157
See application file for complete search history.

(56) References Cited

U.S. PATENT DOCUMENTS

2001/0023392 A1* 9/2001 Nakatsuhama ..... G06F 11/0757
702/120
2007/0030079 A1    2/2007 Kawamoto et al. ............ 331/16
(Continued)

FOREIGN PATENT DOCUMENTS

CN    101682296 A    3/2010
CN    103441760 A    12/2013

OTHER PUBLICATIONS

International Search Report of corresponding International PCT Application No. PCT/CN2014/078264, dated Sep. 23, 2014.

*Primary Examiner* — Lincoln Donovan
*Assistant Examiner* — Patrick Chen
(74) *Attorney, Agent, or Firm* — J.C. Patents

(57) ABSTRACT

A phase locked loop frequency calibration circuit and a method are provided. The circuit includes a timer, a counter, a control module, a frequency divider and a voltage controlled oscillator; output of voltage controlled oscillator is connected with first input of frequency divider, output of frequency divider is connected with first input of counter, second input of frequency divider, first input of timer and second input of counter are respectively connected with first output of control module, third input of counter is connected with output of timer, output of counter is connected with first input of control module, a reference clock signal is respectively sent to second input of timer and second input of control module, the number of clocks used by frequency divider to perform frequency division on output clock signal of voltage controlled oscillator is sent to third input of control module.

11 Claims, 5 Drawing Sheets

(51) Int. Cl.
*H03L 7/099* (2006.01)
*H03L 7/089* (2006.01)
*H03L 7/093* (2006.01)
*H03L 7/181* (2006.01)
*H03L 7/08* (2006.01)

(52) U.S. Cl.
CPC .............. *H03L 7/099* (2013.01); *H03L 7/181* (2013.01); *H03L 2207/06* (2013.01)

(56) References Cited

U.S. PATENT DOCUMENTS

| | | | |
|---|---|---|---|
| 2010/0213984 A1* | 8/2010 | Shin | H03L 7/087 327/105 |
| 2011/0032011 A1 | 2/2011 | Kim et al. | 327/156 |
| 2011/0260763 A1* | 10/2011 | Wang | H03L 7/087 327/157 |
| 2012/0280732 A1* | 11/2012 | Roytman | H03K 5/086 327/175 |

\* cited by examiner

PHASE LOCKED LOOP FREQUENCY CALIBRATION CIRCUIT AND METHOD

CROSS-REFERENCE TO RELATED APPLICATIONS

This application is a continuation of International Application No. PCT/CN2014/078264, filed on May 23, 2014, which claims priority to Chinese Patent Application No. 201310724463.8, filed on Dec. 24, 2013, entitled "PHASE LOCKED LOOP FREQUENCY CALIBRATION CIRCUIT AND METHOD", both of which are hereby incorporated by reference in their entireties.

TECHNICAL FIELD

The invention relates to communication technologies, and in particular to a phase locked loop frequency calibration circuit and a method.

BACKGROUND

A phase locked loop is mainly composed of a phase frequency detector, a charge pump, a loop filter, a voltage controlled oscillator, a frequency divider and an automatic frequency calibration module. Frequency calibration techniques mainly fall into two categories: a closed-loop frequency calibration technique, and an open-loop frequency calibration technique. However, a calibration algorithm exerts a great influence on calibration time taken to calibrate frequency of the voltage controlled oscillator for both the closed-loop frequency calibration technique and the open-loop frequency calibration technique.

In the prior art, what is commonly adopted is a calibration algorithm which carries out successive comparison, in which if the voltage controlled oscillator is provided with an N-bit wide switched capacitor array C<N-1, 0>, the weight between each bit is 2:1, then the most times of comparisons is N-1$^{th}$ power of 2, and the number of calibrations will be greatly increased when N is relatively great, leading to very long calibration time. Therefore, how to reduce the calibration time taken to calibrate output frequency of the voltage controlled oscillator is a problem to be solved urgently.

SUMMARY

The present invention provides a phase locked loop frequency calibration circuit and a method, so as to solve the problem of long calibration time taken to calibrate output frequency of a voltage controlled oscillator.

A first aspect of the present invention provides a phase locked loop frequency calibration circuit, including: a timer, a counter, a control module, a frequency divider and a voltage controlled oscillator;

an output of the voltage controlled oscillator is connected with a first input of the frequency divider, an output of the frequency divider is connected with a first input of the counter, a second input of the frequency divider, a first input of the timer, and a second input of the counter are respectively connected with a first output of the control module, a third input of the counter is connected with an output of the timer, an output of the counter is connected with a first input of the control module, a reference clock signal is sent to a second input of the timer and a second input of the control module, respectively, the number of clocks used by the frequency divider to perform frequency division on an output clock signal of the voltage controlled oscillator is sent to a third input of the control module, and an output capacitor array control word of a second output of the control module is sent to an input of the voltage controlled oscillator;

the control module is configured to: clear the timer, the counter and the frequency divider, respectively, and control the counter to count an output clock signal of the frequency divider within a preset time, where the preset time is the duration required for the timer to change from zero to overflow; obtain a count value A resulting from the counter counting the output clock signals of the frequency divider within the preset time; calculate output frequency P' of the voltage controlled oscillator according to the count value A, and compare the output frequency with an expected frequency; and if an absolute value of a difference between the output frequency and the expected frequency is greater than or equal to a preset difference value, then adjust the number of switched capacitors of the voltage controlled oscillator, so as to adjust the output frequency of the voltage controlled oscillator.

In an embodiment of the phase locked loop frequency calibration circuit, optionally, the control module is specifically configured to calculate the output frequency P' of the voltage controlled oscillator according to the count value A, wherein $$P' = \frac{A \times N}{M} \times P,$$

N is the number of clocks used by the frequency divider to perform frequency division on the output clock signal of the voltage controlled oscillator, M is the number of cycles of a reference clock signal, and P is frequency of the reference clock signal.

In an embodiment of the phase locked loop frequency calibration circuit, optionally, the control module is specifically configured to, when the absolute value of the difference between the output frequency and the expected frequency is greater than or equal to the preset difference value, if the difference is positive, increase the number of switched capacitors of the voltage controlled oscillator, so as to reduce the output frequency of the voltage controlled oscillator; and if the difference is negative, reduce the number of switched capacitors of the voltage controlled oscillator, so as to increase the output frequency of the voltage controlled oscillator.

In an embodiment of the phase locked loop frequency calibration circuit, optionally, the control module is specifically configured to calculate, according to a value of the difference and corresponding relation between each switched capacitor array of the voltage controlled oscillator and the output frequency of the voltage controlled oscillator, the number of switched capacitors of the voltage controlled oscillator that needs to be adjusted, and specifically:

if the difference is positive, increase the number of switched capacitors of the voltage controlled oscillator, according to the calculated number of switched capacitors of the voltage controlled oscillator that needs to be adjusted, so as to reduce the output frequency of the voltage controlled oscillator;

if the difference is negative, reduce the number of switched capacitors of the voltage controlled oscillator, according to the calculated number of switched capacitors of the voltage controlled oscillator that needs to be adjusted, so as to increase the output frequency of the voltage controlled oscillator.

In an embodiment of the phase locked loop frequency calibration circuit, optionally, the control module is also configured to, after completing the adjustment of the number of switched capacitors of the voltage controlled oscillator, obtain a new number of times by adding 1 to the times of adjusting the number of switched capacitors of the voltage controlled oscillator, and determine whether the new number of times is smaller than or equal to the number of control bits of switched capacitors of the voltage controlled oscillator; and if yes, clear the timer, the counter and the frequency divider respectively, and control the counter to count the output clock signal of the frequency divider within the preset time.

An embodiment of the phase locked loop frequency calibration circuit, optionally, also includes: a charge pump, a first switch element, a loop filter, a second switch element and a power module; where:

the first switch element is connected between an output of the charge pump and an input of the loop filter, an output of the loop filter is connected with an input of the voltage controlled oscillator and one end of the second switch element respectively, the other end of the second switch element is connected with one end of the power module, and the other end of the power module is connected to ground;

the control module is also configured to, before counting, by the counter, the output clock signals of the frequency divider within the preset time, break the first switch element and close the second switch element, so as to enable a control voltage of the voltage controlled oscillator to be equal to an expected operating voltage locked by the phase locked loop, enable a control word of the switched capacitors of the voltage controlled oscillator to be set as a median value within a range of values indicated by the control bit of the voltage controlled oscillator, and enable a capacitor of the loop filter to be pre-charged.

Another aspect of the present invention provides a phase locked loop frequency calibration method, including:

clearing a timer, a counter and a frequency divider, respectively, and controlling the counter to count an output clock signal of a frequency divider within a preset time, where the preset time is the duration required for the timer to change from zero to overflow;

obtaining a count value A resulting from the counter counting the output clock signal of the frequency divider within the preset time;

calculating output frequency P' of the voltage controlled oscillator according to the count value A, and comparing the output frequency with an expected frequency; and if an absolute value of a difference between the output frequency and the expected frequency is greater than or equal to a preset difference value, then adjusting the number of switched capacitors of the voltage controlled oscillator, so as to adjust the output frequency of the voltage controlled oscillator.

In an embodiment of the phase locked loop frequency calibration method, optionally, calculating the output frequency of the voltage controlled oscillator according to the count value includes:

calculating the output frequency P' of the voltage controlled oscillator according to the count value A, wherein $$P' = \frac{A \times N}{M} \times P,$$

N is the number of clocks used by the frequency divider to perform frequency division on an output clock signal of the voltage controlled oscillator, M is the number of cycles of a reference clock signal, and P is frequency of the reference clock signal.

In an embodiment of the above phase locked loop frequency calibration method, optionally, when the absolute value of the difference between the output frequency and the expected frequency is greater than or equal to the preset difference value, if the difference is positive, increase the number of switched capacitors of the voltage controlled oscillator, so as to reduce the output frequency of the voltage controlled oscillator; and if the difference is negative, reduce the number of switched capacitors of the voltage controlled oscillator, so as to increase the output frequency of the voltage controlled oscillator.

In an embodiment of the above phase locked loop frequency calibration method, optionally, according to a value of the difference and corresponding relation between each switched capacitor array of the voltage controlled oscillator and the output frequency of the voltage controlled oscillator, calculate the number of switched capacitors of the voltage controlled oscillator that needs to be adjusted, specifically:

if the difference is positive, increase the number of switched capacitors of the voltage controlled oscillator according to the calculated number of switched capacitors of the voltage controlled oscillator that needs to be adjusted, so as to reduce the output frequency of the voltage controlled oscillator; and if the difference is negative, reduce the number of switched capacitors of the voltage controlled oscillator according to the calculated number of switched capacitors of the voltage controlled oscillator that needs to be adjusted, so as to improve the output frequency of the voltage controlled oscillator.

In an embodiment of the phase locked loop frequency calibration method, optionally, after completing the adjustment of the number of switched capacitors of the voltage controlled oscillator, the method also includes:

obtaining a new number of times by adding 1 to the times of adjusting the number of switched capacitors of the voltage controlled oscillator, and determining whether the new number of times is smaller than or equal to the number of control bits of switched capacitors of the voltage controlled oscillator;

if the new number of times is smaller than or equal to the number of control bits of switched capacitors of the voltage controlled oscillator, clear the timer, the counter and the frequency divider respectively, and control the counter to count the output clock signal of the frequency divider within the preset time.

In an embodiment of the phase locked loop frequency calibration method, optionally, before counting, by the counter, the output clock signals of the frequency divider within the preset time, the method also includes:

breaking a first switch element and closing a second switch element, so as to enable a control voltage of the voltage controlled oscillator to be equal to an expected operating voltage locked by the phase locked loop, enable a control word of the switched capacitors of the voltage controlled oscillator to be set as a median value within a range of values indicated by the control bit of the voltage controlled oscillator, and enable a capacitor of the loop filter to be pre-charged.

In the phase locked loop frequency calibration circuit and the method provided by the present invention, by respectively clearing the timer, the counter and the frequency divider, and controlling the counter to count the output clock signal of the frequency divider within the preset time to obtain the count value, then the output frequency of the voltage controlled oscillator is calculated according to the count value, and compared with the expected frequency. If the absolute value of the difference between the output frequency and the expected frequency is greater than or equal to the preset difference value, the number of switched capacitors of the voltage controlled oscillator is adjusted, so as to adjust the output frequency of the voltage controlled oscillator, thereby realizing fast calibration on the output frequency of the voltage controlled oscillator, and shortening the calibration time.

DESCRIPTION OF EMBODIMENTS

In order to make the purpose, technical solutions and advantages of the present invention clearer, technical solutions of embodiments of the present invention will be described hereafter clearly with accompanied drawings thereof. Apparently, the described embodiments are just part rather than all of the embodiments of the present invention. All the other embodiments obtained based on the embodiments of the present invention by those skilled in the art without creative effort shall fall into the protection scope of the present invention.

Figure 1:
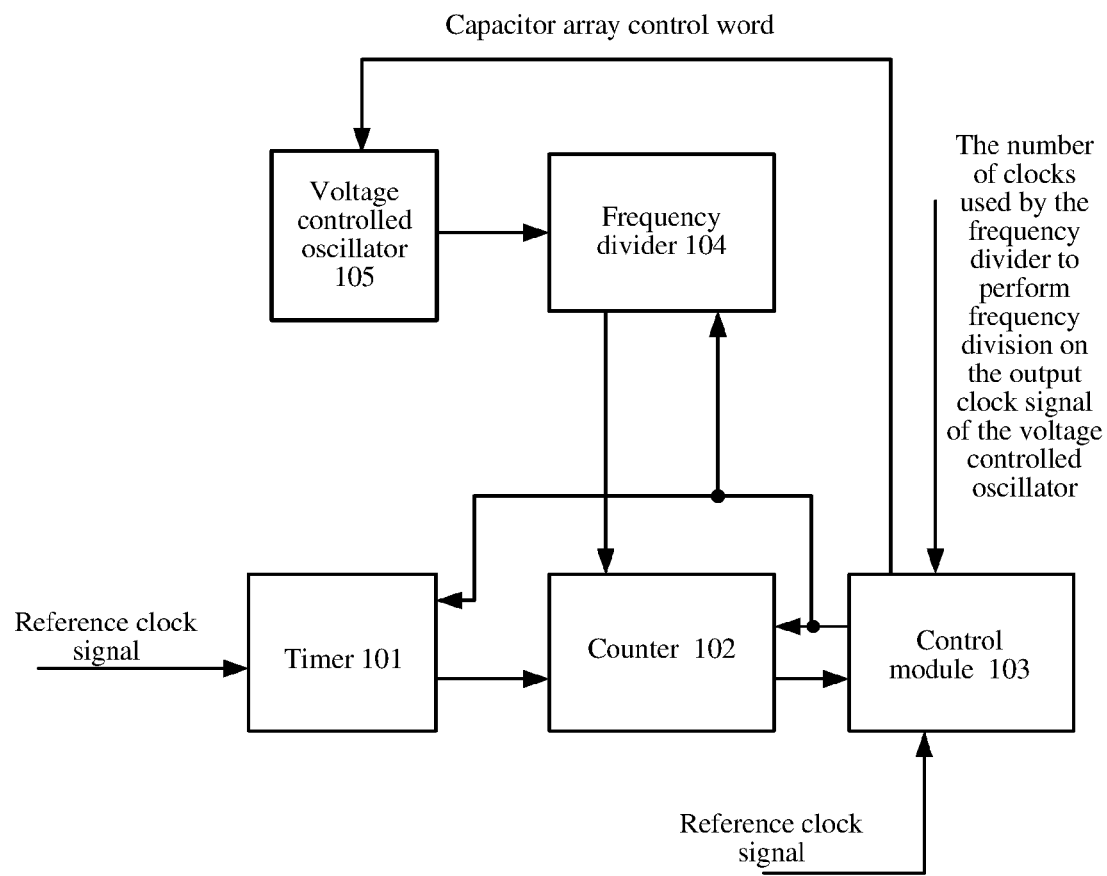
FIG. 1 is a circuit diagram of a phase locked loop frequency calibration circuit provided by an embodiment of the present invention.

FIG. 1 is a circuit diagram of a phase locked loop frequency calibration circuit provided by an embodiment of the present invention. In this embodiment, a phase locked loop control module includes: a timer 101, a counter 102, a control module 103, a frequency divider 104 and a voltage controlled oscillator 105.

An output of the voltage controlled oscillator 105 is connected with a first input of the frequency divider 104, an output of the frequency divider 104 is connected with a first input of the counter 102, a second input of the frequency divider 104, a first input of the timer 101 and a second input of the counter 102 are respectively connected with a first output of the control module 103, a third input of the counter 102 is connected with an output of the timer 101, an output of the counter 102 is connected with a first input of the control module 103, a reference clock signal is respectively sent to a second input of the timer 101 and a second input of the control module 103, the number of clocks used by the frequency divider to perform frequency division on an output clock signal of the voltage controlled oscillator 105 is sent to a third input of the control module 103, and an output capacitor array control word of a second output of the control module 103 is sent to an input of the voltage controlled oscillator 105.

The control module 103 can be a state machine, and the control module 103 is configured to: clear the timer, the counter and the frequency divider respectively, and control the counter to count an output clock signal of the frequency divider within a preset time, where the preset time is the duration required for the timer to change from zero to overflow; obtain a count value resulting from the counter counting the output clock signals of the frequency divider within the preset time; and, calculate output frequency of the voltage controlled oscillator according to the count value, and compare the output frequency with an expected frequency; and if the absolute value of the difference between the output frequency and the expected frequency is greater than or equal to a preset difference value, adjust the number of switched capacitors of the voltage controlled oscillator, so as to adjust the output frequency of the voltage controlled oscillator.

In the phase locked loop frequency calibration circuit provided by this embodiment, by respectively clearing the timer, the counter and the frequency divider, and controlling the counter to count the output clock signal of the frequency divider within the preset time to obtain the count value. The output frequency of the voltage controlled oscillator is then calculated according to the count value, and compared with the expected frequency. If the absolute value of the difference between the output frequency and the expected frequency is greater than or equal to the preset difference value, the number of switched capacitors of the voltage controlled oscillator is adjusted, so as to adjust the output frequency of the voltage controlled oscillator. The phase locked loop frequency calibration circuit provided by this embodiment allows the output frequency of the voltage controlled oscillator to reach the expected frequency after twice calibrations, at the most, thus reducing the times of calibrations, realizing fast automatic calibration of the output frequency of the voltage controlled oscillator, thereby reducing the calibration time.

Figure 2:
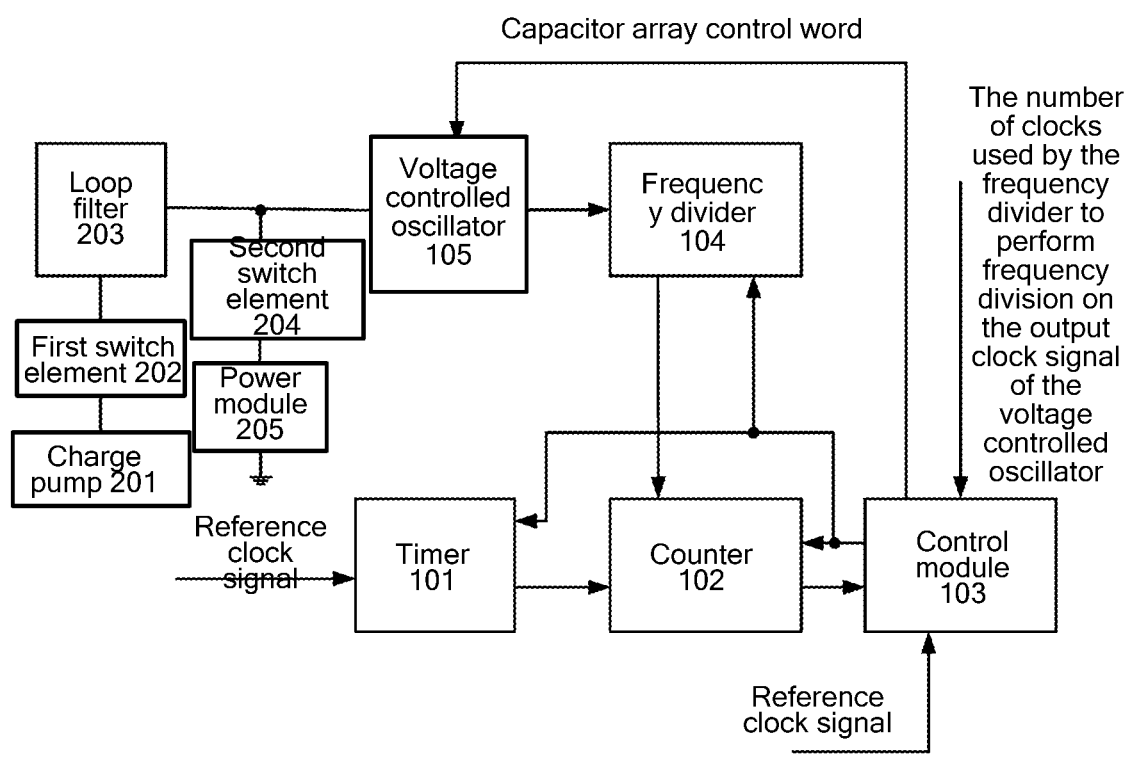
FIG. 2 is a circuit diagram of a phase locked loop frequency calibration circuit provided by another embodiment of the present invention.

Further, on the basis of the above embodiment, the phase locked loop control module may also include: a charge pump 201, a first switch element 202, a loop filter 203, a second switch element 204 and a power module 205. FIG. 2 is a circuit diagram of a phase locked loop frequency calibration circuit provided by another embodiment of the present invention. Referring to FIG. 2, the timer 101, the counter 102, the control module 103, the frequency divider 104, the voltage controlled oscillator 105, the charge pump 201, the first switch element 202, the loop filter 203, the second switch element 204 and the power module 205 are connected in a manner as follows: one end of the first switch element 202 is connected with an output of the charge pump 201, and the other end is connected with an input of the loop filter 203; an output of the loop filter 203 is connected with an input of the voltage controlled oscillator 105 and one end of the second switch element 204 respectively, and the other end of the second switch element 204 is connected with one end of the power module 205; the other end of the power module 205 is connected to ground; an output of the voltage controlled oscillator 105 is connected with a first input of the frequency divider 104; an output of the frequency divider 104 is connected with a first input of the counter 102; a second input of the frequency divider 104, a first input of the timer 101, and a second input of the counter 102 are respectively connected with a first output of the control module 103; a third input of the counter 102 is connected with an output of the timer 101; an output of the counter 102 is connected with a first input of the control module 103; a reference clock signal is respectively sent to a second input of the timer 101 and a second input of the control module 103; the number of clocks used by the frequency divider 104 to perform frequency division on an output clock signal of the voltage controlled oscillator 105 is sent to a third input of the control module 103; and an output capacitor array control word of a second output of the control module 103 is sent to an input of the voltage controlled oscillator 105.

The control module 103 is specifically configured to calculate, according to the count value A, the output frequency P' of the voltage controlled oscillator 105, wherein $$P' = \frac{A \times N}{M} \times P,$$

N is the number of clocks used by the frequency divider 104 to perform frequency division on an output clock signal of the voltage controlled oscillator 105, M is the number of cycles of the reference clock signal, and P is frequency of the reference clock signal.

Further, the control module 103 is specifically configured to increase the number of switched capacitors of the voltage controlled oscillator 105 so as to reduce the output frequency of the voltage controlled oscillator 105, when the absolute value of the difference between the output frequency and the expected frequency is greater than or equal to the preset difference value, and the difference is positive.

Further, the control module 103 is specifically configured to calculate, according to the value of a positive difference and corresponding relation between each switched capacitor array of the voltage controlled oscillator 105 and the output frequency of the voltage controlled oscillator 105, the number of switched capacitors of the voltage controlled oscillator 105 that needs to be increased; and increase the number of switched capacitors of the voltage controlled oscillator 105 according to the calculated number of switched capacitors of the voltage controlled oscillator 105 that needs to be increased, so as to reduce the output frequency of the voltage controlled oscillator 105.

Further, the control module 103 is specifically configured to reduce the number of switched capacitors of the voltage controlled oscillator 105 so as to increase the output frequency of the voltage controlled oscillator 105, when the absolute value of the difference between the output frequency and the expected frequency is greater than or equal to the preset difference value, and the difference is negative.

Further, the control module 103 is specifically configured to calculate, according to the value of a negative difference and corresponding relation between each switched capacitor array of the voltage controlled oscillator 105 and the output frequency of the voltage controlled oscillator 105, the number of switched capacitors of the voltage controlled oscillator 105 that needs to be reduced; and reduce the number of switched capacitors of the voltage controlled oscillator 105 according to the calculated number of switched capacitors of the voltage controlled oscillator 105 that needs to be reduced, so as to increase the output frequency of the voltage controlled oscillator 105.

Further, the control module 103 is also configured to, after adjusting the number of switched capacitors of the voltage controlled oscillator 105, obtain the new number of times by adding 1 to the times of adjusting the number of switched capacitors of the voltage controlled oscillator 105, and determine whether the new number of times is smaller than or equal to the number of control bits of switched capacitors of the voltage controlled oscillator 105; and clear the timer 101, the counter 102 and the frequency divider 104 respectively, and control the counter 102 to count the output clock signal—of the frequency divider within the preset time, when the new number of times is smaller than or equal to the number of control bits of switched capacitors of the voltage controlled oscillator 105.

Further, the control module 103 is also configured to, before counting, by the counter, the output clock signals of the frequency divider within the preset time, break the first switch element and close the second switch element, so as to enable a control voltage of the voltage controlled oscillator to be equal to an expected operating voltage locked by the phase locked loop, enable a control word of the switched capacitors of the voltage controlled oscillator to be set as a median value within a range of values indicated by the control bit of the voltage controlled oscillator, and enable a capacitor of the loop filter to be pre-charged, thereby realizing charging the capacitor of the loop filter without taking extra time, and reducing locked time of the phase locked loop.

Besides having the same working principle and technical effects as those of the phase locked loop frequency calibration circuit provided by the above embodiment, the phase locked loop frequency calibration circuit provided by this embodiment enables the control voltage of the voltage controlled oscillator to be equal to the expected operating voltage locked by the phase locked loop, enables the control word of the switched capacitors of the voltage controlled oscillator to be set as the median value within the range of values indicated by the control bit of the voltage controlled oscillator, and enables the capacitor of the loop filter to be pre-charged, by breaking the first switch element and closing the second switch element, thereby realizing charging the capacitor of the loop filter without taking extra time, and reducing locked time of the phase locked loop.

Figure 3:
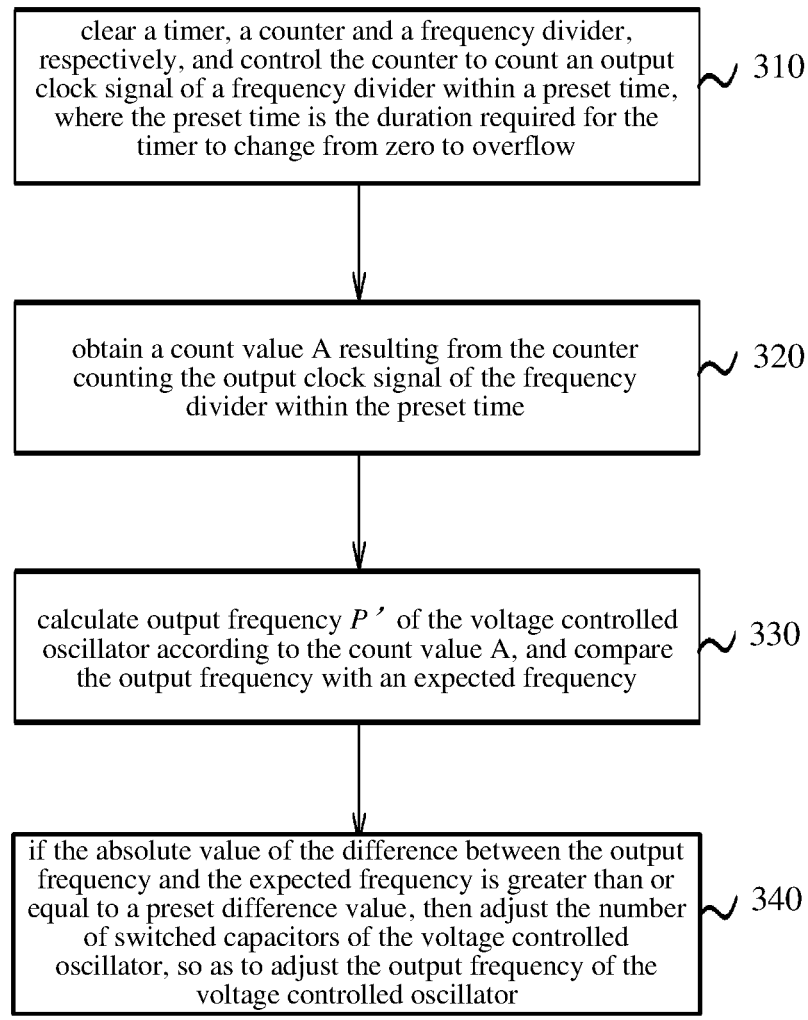
FIG. 3 is a flow chart of a phase locked loop frequency calibration method provided by an embodiment of the present invention.

FIG. 3 is a flow chart of a phase locked loop frequency calibration method provided by an embodiment of the present invention. Referring to FIG. 3, the method in this embodiment includes the following steps:

Step 310, clear a timer, a counter and a frequency divider, respectively, and control the counter to count an output clock signal of a frequency divider within a preset time, where the preset time is the duration required for the timer to change from zero to overflow.

Step 320, obtain a count value A resulting from the counter counting the output clock signal of the frequency divider within the preset time.

Step 330, calculate output frequency of the voltage controlled oscillator according to the count value A, and compare the output frequency with an expected frequency.

Step 340, if the absolute value of the difference between the output frequency and the expected frequency is greater than or equal to a preset difference value, then adjust the number of switched capacitors of the voltage controlled oscillator, so as to adjust the output frequency of the voltage controlled oscillator.

In the phase locked loop frequency calibration method provided by this embodiment, by respectively clearing the timer, the counter and the frequency divider, and controlling the counter to count the output clock signal of the frequency divider within the preset time to obtain the count value, the output frequency of the voltage controlled oscillator is then calculated according to the count value, and compared with the expected frequency. If the absolute value of the difference between the output frequency and the expected frequency is greater than or equal to the preset difference value, the number of switched capacitors of the voltage controlled oscillator is adjusted, so as to adjust the output frequency of the voltage controlled oscillator, thereby realizing fast automatic calibration of the output frequency of the voltage controlled oscillator, and reducing calibration time.

Figure 4:
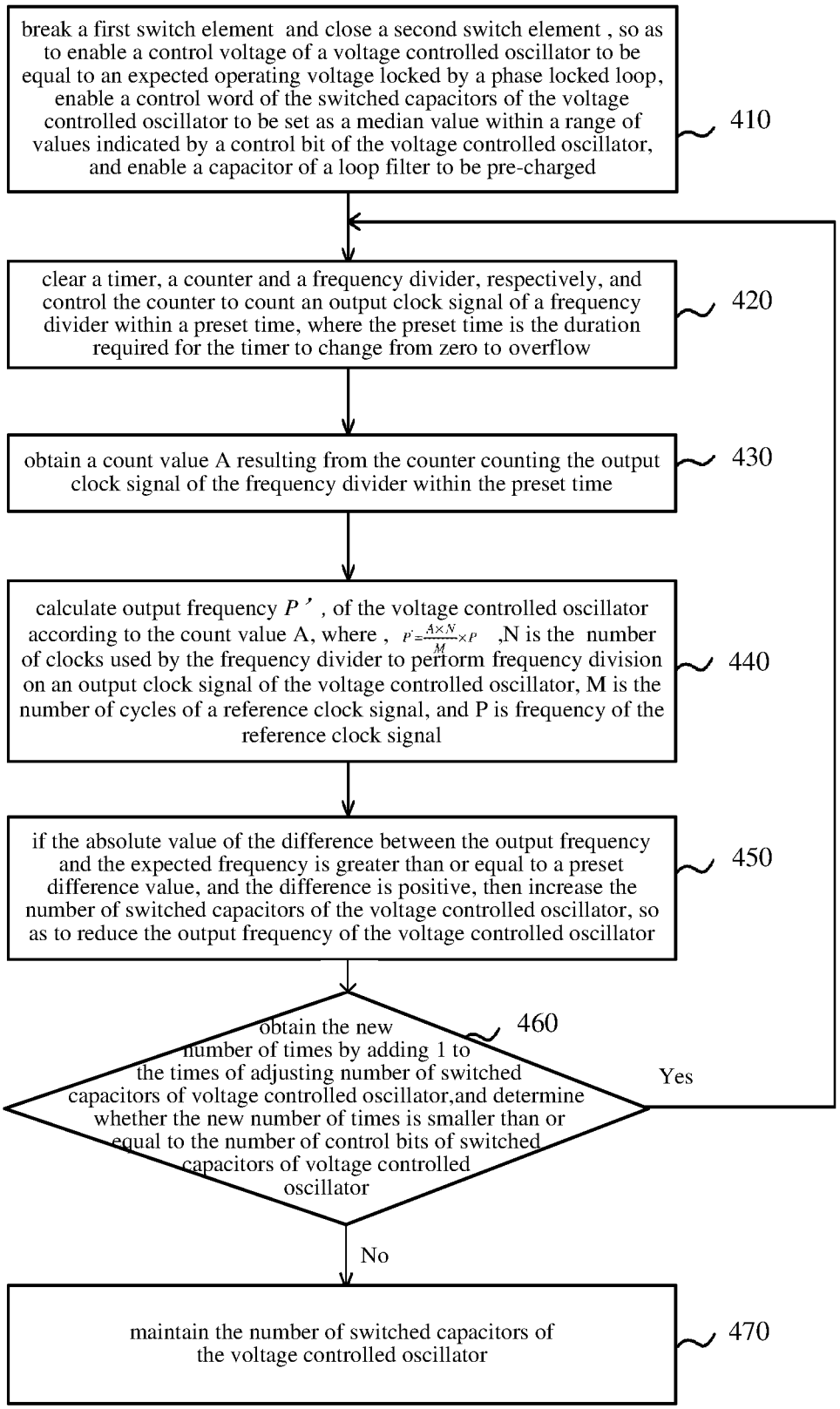
FIG. 4 is a flow chart of a phase locked loop frequency calibration method provided by another embodiment of the present invention.

FIG. 4 is a flow chart of a phase locked loop frequency calibration method provided by another embodiment of the present invention. Referring to FIG. 4, the method of this embodiment includes the following steps:

Step 410, break a first switch element and close a second switch element, so as to enable a control voltage of a voltage controlled oscillator to be equal to an expected operating voltage locked by a phase locked loop, enable a control word of the switched capacitors of the voltage controlled oscillator to be set as a median value within a range of values indicated by a control bit of the voltage controlled oscillator, and enable a capacitor of a loop filter to be pre-charged.

Step 420, clear a timer, a counter and a frequency divider, respectively, and control the counter to count an output clock signal of a frequency divider within a preset time, where the preset time is the duration required for the timer to change from zero to overflow.

Step 430, obtain a count value A resulting from the counter counting the output clock signal of the frequency divider within the preset time.

Step 440, calculate output frequency P' of the voltage controlled oscillator according to the count value A, wherein $$P' = \frac{A \times N}{M} \times P,$$

N is the number of clocks used by the frequency divider to perform frequency division on an output clock signal of the voltage controlled oscillator, M is the number of cycles of a reference clock signal, and P is frequency of the reference clock signal.

Step 450, if the absolute value of the difference between the output frequency and the expected frequency is greater than or equal to a preset difference value, and the difference is positive, then increase the number of switched capacitors of the voltage controlled oscillator so as to reduce the output frequency of the voltage controlled oscillator.

For example, increasing the number of switched capacitors of the voltage controlled oscillator to reduce the output frequency of the voltage controlled oscillator can be realized in the following approach:

calculate, according to the value of a positive difference and corresponding relation between each switched capacitor array of the voltage controlled oscillator and the output frequency of the voltage controlled oscillator, the number of switched capacitors of the voltage controlled oscillator that needs to be increased; and increase the number of switched capacitors of the voltage controlled oscillator according to the calculated number of switched capacitors of the voltage controlled oscillator that needs to be increased, so as to reduce the output frequency of the voltage controlled oscillator.

Step 460, obtain the new number of times by adding 1 to the times of adjusting the number of switched capacitors of the voltage controlled oscillator, and determine whether the new number of times is smaller than or equal to the number of control bits of switched capacitors of the voltage controlled oscillator. If yes, execute step 420, otherwise execute step 470.

Step 470, maintain the number of switched capacitors of the voltage controlled oscillator.

It should be noted that, from step 450 to step 460, because the output frequency of the voltage controlled oscillator corresponding to each switched capacitor array is designed along with the circuit, the number of switched capacitors that needs to be increased may be reversely deduced according to the difference between the output frequency and the expected frequency. After increasing the number of the switched capacitors, the new number of times is obtained by adding 1 to the times of adjusting the number of switched capacitors of the voltage controlled oscillator, and whether the new number of times is smaller than or equal to the number of control bits of switched capacitors of the voltage controlled oscillator is determined. If yes, step 420 is executed to calibrate the output frequency of the voltage controlled oscillator. The phase locked loop frequency calibration method provided by this embodiment allows the output frequency of the voltage controlled oscillator to reach the expected frequency after twice calibrations, at the most, thus reducing the times of calibrations, realizing fast automatic calibration of the output frequency of the voltage controlled oscillator, thereby reducing calibration time.

In the phase locked loop frequency calibration method provided by this embodiment, by breaking the first switch element and closing the second switch element, the control voltage of the voltage controlled oscillator is enabled to be equal to the expected operating voltage locked by the phase locked loop, the control word of the switched capacitors of the voltage controlled oscillator is set as the median value within the range of values indicated by the control bit of the voltage controlled oscillator, and the capacitor of the loop filter is pre-charged, thereby realizing charging the capacitor of the loop filter without taking extra time, and reducing locked time of the phase locked loop. And the same method respectively clears the timer, the counter and the frequency divider, and controls the counter to count the output clock signal of the frequency divider within the preset time; obtains the count value resulting from the counter counting the output clock signal of the frequency divider within the preset time; calculates the output frequency of the voltage controlled oscillator according to the count value, and compares the output frequency with the expected frequency; and if the absolute value of the difference between the output frequency and the expected frequency is greater than or equal to the preset difference value and the difference is positive, then increase the number of switched capacitors of the voltage controlled oscillator, so as to reduce the output frequency of the voltage controlled oscillator. The phase locked loop frequency calibration method provided by this embodiment allows the output frequency of the voltage controlled oscillator to reach the expected frequency after twice calibrations, at the most, thus reducing the times of calibrations, realizing fast automatic calibration of the output frequency of the voltage controlled oscillator, thereby reducing calibration time.

Figure 5:
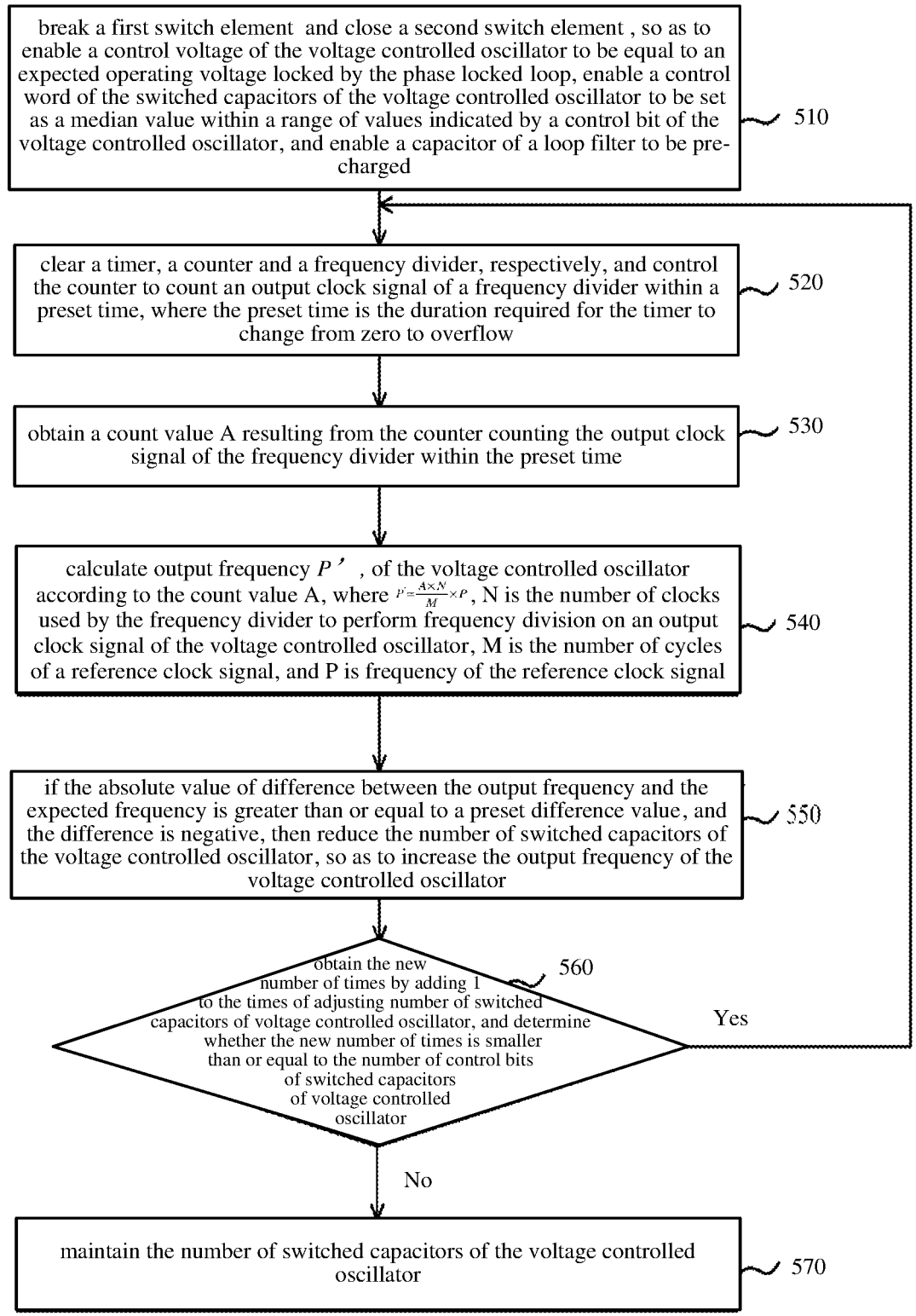
FIG. 5 is a flow chart of a phase locked loop frequency calibration method provided by still another embodiment of the present invention.

FIG. 5 is a flow chart of a phase locked loop frequency calibration method provided by still another embodiment of the present invention. Referring to FIG. 5, the method of this embodiment also includes the following steps:

Step 510, break a first switch element and close a second switch element to enable a control voltage of the voltage controlled oscillator to be equal to an expected operating voltage locked by the phase locked loop, enable a control word of the switched capacitors of the voltage controlled oscillator to be set as a median value within a range of values indicated by a control bit of the voltage controlled oscillator, and enable a capacitor of a loop filter to be pre-charged.

Step 520, clear a timer, a counter and a frequency divider, respectively, and control the counter to count an output clock signal of a frequency divider within a preset time, where the preset time is the duration required for the timer to change from zero to overflow.

Step 530, obtain a count value A resulting from the counter counting the output clock signal of the frequency divider within the preset time.

Step 540, calculate output frequency P′ of the voltage controlled oscillator according to the count value A, wherein $$P' = \frac{A \times N}{M} \times P,$$

N is the number of clocks used by the frequency divider to perform frequency division on an output clock signal of the voltage controlled oscillator, M is the number of cycles of a reference clock signal, and P is frequency of the reference clock signal.

Step 550, if the absolute value of the difference between the output frequency and the expected frequency is greater than or equal to a preset difference value, and the difference is negative, then reduce the number of switched capacitors of the voltage controlled oscillator, so as to increase the output frequency of the voltage controlled oscillator.

For example, reducing the number of switched capacitors of the voltage controlled oscillator to increase the output frequency of the voltage controlled oscillator can be realized in the following approach:

calculate, according to the value of a negative difference and corresponding relation between each switched capacitor array of the voltage controlled oscillator and the output frequency of the voltage controlled oscillator, the number of switched capacitors of the voltage controlled oscillator that needs to be reduced; and reduce the number of switched capacitors of the voltage controlled oscillator according to the calculated number of switched capacitors of the voltage controlled oscillator that needs to be reduced, so as to increase the output frequency of the voltage controlled oscillator.

Step 560, obtain the new number of times by adding 1 to the times of adjusting the number of switched capacitors of the voltage controlled oscillator, and determine whether the new number of times is smaller than or equal to the number of control bits of switched capacitors of the voltage controlled oscillator. If yes, execute step 520, otherwise execute step 570.

Step 570, maintain the number of switched capacitors of the voltage controlled oscillator.

It should be noted that, from step 550 to step 560, because the output frequency of the voltage controlled oscillator corresponding to each switched capacitor array is designed along with the circuit, the number of switched capacitors that needs to be reduced can be reversely deduced according to the difference between the output frequency and the expected frequency. After reducing the number of the switched capacitors, the new number of times is obtained by adding 1 to the times of reducing the number of switched capacitors of the voltage controlled oscillator, and whether the new number of times is smaller than or equal to the number of control bits of switched capacitors of the voltage controlled oscillator is determined. If yes, step 520 is executed to calibrate the output frequency of the voltage controlled oscillator.

In the phase locked loop frequency calibration method provided by this embodiment, by breaking the first switch element and opening the second switch element, the control voltage of the voltage controlled oscillator is enabled to be equal to the expected operating voltage locked by the phase locked loop, the control word of the switched capacitors of the voltage controlled oscillator is set as the median value within the range of values indicated by the control bit of the voltage controlled oscillator, and the capacitor of the loop filter is pre-charged, thereby realizing charging the capacitor of the loop filter without taking extra time, and reducing locked time of the phase locked loop. And the same method respectively clears the timer, the counter and the frequency divider, and controls the counter to count the output clock signal of the frequency divider within the preset time, obtains the count value resulting from the counter counting the output clock signal of the frequency divider within the preset time; calculates the output frequency of the voltage controlled oscillator according to the count value, and compares the output frequency with the expected frequency. If the absolute value of the difference between the output frequency and the expected frequency is greater than or equal to the preset difference value and the difference is negative, then reduce the number of switched capacitors of the voltage controlled oscillator, so as to increase the output frequency of the voltage controlled oscillator. The phase locked loop frequency calibration method provided by this embodiment allows the output frequency of the voltage controlled oscillator to reach the expected frequency after twice calibrations, at the most, thus reducing the times of calibrations, realizing fast automatic calibration of the output frequency of the voltage controlled oscillator, thereby reducing calibration time.

One of ordinary skill in the art can understand that part or all of the steps for realizing the embodiments of the method can be conducted by hardware related to program instructions. The program can be stored in a computer readable storage medium. During execution, the program executes the steps included in embodiments of the method; and the aforementioned storage medium includes various media that can store program code, such as a ROM, a RAM, a disk or a CD.

Finally, it should be noted that: the above embodiments are merely used to illustrate, rather than to limit technical solutions of the present invention; and although the present invention is described in detail according to the embodiments above, those skilled in the art should understand that modifications can be made to the technical solutions described in the aforementioned embodiments, or that equivalent replacements can be made to part or all of the technical features therein; and neither these modifications nor replacements shall make essence of corresponding technical solutions depart from the scope of the technical solutions in the embodiments of the present invention.

What is claimed is:

1. A phase locked loop frequency calibration circuit, comprising a timer, a counter, a control module, a frequency divider and a voltage controlled oscillator;

an output of the voltage controlled oscillator is connected with a first input of the frequency divider, an output of the frequency divider is connected with a first input of the counter, a second input of the frequency divider, a first input of the timer, and a second input of the counter are respectively connected with a first output of the control module, a third input of the counter is connected with an output of the timer, an output of the counter is connected with a first input of the control module, a reference clock signal is sent to a second input of the timer and a second input of the control module, respectively, a number of clocks used by the frequency divider to perform frequency division on an output clock signal of the voltage controlled oscillator is sent to a third input of the control module, an output capacitor array control word of a second output of the control module is sent to an input of the voltage controlled oscillator;

the control module is configured to: clear the timer, the counter and the frequency divider, respectively, and control the counter to count an output clock signal of the frequency divider within a preset time, wherein the preset time is duration required for the timer to change from zero to overflow; obtain a count value A resulting from the counter counting the output clock signal of the frequency divider within the preset time; calculate output frequency of the voltage controlled oscillator according to the count value A, and compare the output frequency with an expected frequency; and if an absolute value of a difference between the output frequency and the expected frequency is greater than or equal to a preset difference value, then adjust a number of switched capacitors of the voltage controlled oscillator, so as to adjust the output frequency of the voltage controlled oscillator.

2. The circuit according to claim 1, wherein, the control module is specifically configured to calculate the output frequency P' of the voltage controlled oscillator according to the count value A, wherein $$P' = \frac{A \times N}{M} \times P,$$

N is the number of clocks used by the frequency divider to perform frequency division on the output clock signal of the voltage controlled oscillator, M is a number of cycles of the reference clock signal, and P is frequency of the reference clock signal.

3. The circuit according to claim 2, wherein, the control module is specifically configured to, when the absolute value of the difference between the output frequency and the expected frequency is greater than or equal to the preset difference value, if the difference is positive, increase the number of switched capacitors of the voltage controlled oscillator, so as to reduce the output frequency of the voltage controlled oscillator;

if the difference is negative, reduce the number of switched capacitors of the voltage controlled oscillator, so as to increase the output frequency of the voltage controlled oscillator.

4. The circuit according to claim 3, wherein, the control module is specifically configured to calculate the number of switched capacitors of the voltage controlled oscillator that needs to be adjusted, according to a value of the difference and corresponding relation between each switched capacitor array of the voltage controlled oscillator and the output frequency of the voltage controlled oscillator, and specifically to:

if the difference is positive, increase the number of switched capacitors of the voltage controlled oscillator, according to the calculated number of switched capacitors of the voltage controlled oscillator that needs to be adjusted, so as to reduce the output frequency of the voltage controlled oscillator;

if the difference is negative, reduce the number of switched capacitors of the voltage controlled oscillator, according to the calculated number of switched capacitors of the voltage controlled oscillator that needs to be adjusted, so as to increase the output frequency of the voltage controlled oscillator.

5. The circuit according to claim 1, wherein, the control module is also configured to, after completing the adjustment of the number of switched capacitors of the voltage controlled oscillator, obtain a new number of times by adding 1 to the times of adjusting the number of switched capacitors of the voltage controlled oscillator, and determine whether the new number of times is smaller than or equal to a number of control bits of switched capacitors of the voltage controlled oscillator; and if yes, clear the timer, the counter and the frequency divider respectively, and control the counter to count the output clock signal of the frequency divider within the preset time.

6. The circuit according to claim 1, also comprising: a charge pump, a first switch element, a loop filter, a second switch element and a power module; wherein:

the first switch element is connected between the charge pump and the loop filter, the second switch element is connected between the loop filter and the power module, and the other end of the power module is connected to ground; and the control module is also configured to, before counting, by the counter, the output clock signal of the frequency divider within the preset time, break the first switch element and close the second switch element, so as to enable a control voltage of the voltage controlled oscillator to be equal to an expected operating voltage locked by the phase locked loop, enable a control word of the switched capacitors of the voltage controlled oscillator to be set as a median value within a range of values indicated by a control bit of the voltage controlled oscillator, and enable a capacitor of the loop filter to be pre-charged.

7. A phase locked loop frequency calibration method, comprising:

clearing a timer, a counter and a frequency divider, respectively, and controlling the counter to count an output clock signal of the frequency divider within a preset time, wherein the preset time is duration required for the timer to change from zero to overflow;

obtaining a count value A resulting from the counter counting the output clock signal of the frequency divider within the preset time;

calculating output frequency of a voltage controlled oscillator according to the count value A, and comparing the output frequency with an expected frequency, wherein, the calculating output frequency of the voltage controlled oscillator according to the count value, comprising:

calculating output frequency P' of the voltage controlled oscillator according to the count value A, wherein $$P' = \frac{A \times N}{M} \times P,$$

N is a number of clocks used by the frequency divider to perform frequency division on the output clock signal of the voltage controlled oscillator, M is a number of cycles of a reference clock signal, and P is frequency of the reference clock signal; and if an absolute value of a difference between the output frequency and the expected frequency is greater than or equal to a preset difference value, then adjusting a number of switched capacitors of the voltage controlled oscillator, so as to adjust the output frequency of the voltage controlled oscillator.

8. The method according to claim 7, wherein, when the absolute value of the difference between the output frequency and the expected frequency is greater than or equal to the preset difference value, if the difference is positive, increasing the number of switched capacitors of the voltage controlled oscillator, so as to reduce the output frequency of the voltage controlled oscillator; and if the difference is negative, reducing the number of switched capacitors of the voltage controlled oscillator, so as to increase the output frequency of the voltage controlled oscillator.

9. The method according to claim 8, wherein, calculating, according to a value of the difference and corresponding relation between each switched capacitor array of the voltage controlled oscillator and the output frequency of the voltage controlled oscillator, the number of switched capacitors of the voltage controlled oscillator that needs to be adjusted, which is specifically:

if the difference is positive, increasing the number of switched capacitors of the voltage controlled oscillator according to the calculated number of switched capacitors of the voltage controlled oscillator that needs to be adjusted, so as to reduce the output frequency of the voltage controlled oscillator;

if the difference is negative, reducing the number of switched capacitors of the voltage controlled oscillator according to the calculated number of switched capacitors of the voltage controlled oscillator that needs to be adjusted, so as to increase the output frequency of the voltage controlled oscillator.

10. The method according to claim 7, wherein, after completing the adjustment of the number of switched capacitors of the voltage controlled oscillator, the method also comprises:

obtaining a new number of times by adding 1 to the times of adjusting the number of switched capacitors of the voltage controlled oscillator, and determining whether the new number of times is smaller than or equal to a number of control bits of switched capacitors of the voltage controlled oscillator;

if the new number of times is smaller than or equal to the number of control bits of switched capacitors of the voltage controlled oscillator, clearing the timer, the counter and the frequency divider respectively, and controlling the counter to count the output clock signal of the frequency divider within the preset time.

11. The method according to claim 7, wherein, before counting, by the counter, the clock signal outputted by the frequency divider within the preset time, the method also comprises:

breaking a first switch element and closing a second switch element, so as to enable a control voltage of the voltage controlled oscillator to be equal to an expected operating voltage locked by the phase locked loop, enable a control word of the switched capacitors of the voltage controlled oscillator to be set as a median value within a range of values indicated by a control bit of the voltage controlled oscillator, and enable a capacitor of a loop filter to be pre-charged.

* * * * *